(12) United States Patent
Ogura

(10) Patent No.: US 8,912,632 B2
(45) Date of Patent: Dec. 16, 2014

(54) SEMICONDUCTOR DEVICE

(75) Inventor: Tsuneo Ogura, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 376 days.

(21) Appl. No.: 13/233,959

(22) Filed: Sep. 15, 2011

(65) Prior Publication Data
US 2012/0074459 A1 Mar. 29, 2012

(30) Foreign Application Priority Data

Sep. 24, 2010 (JP) .................................. 2010-213221

(51) Int. Cl.
| H01L 29/66 | (2006.01) |
| H01L 29/423 | (2006.01) |
| H01L 29/10 | (2006.01) |
| H01L 29/739 | (2006.01) |
| H01L 29/06 | (2006.01) |

(52) U.S. Cl.
CPC ........ H01L 29/7397 (2013.01); H01L 29/4236 (2013.01); H01L 29/1095 (2013.01); H01L 29/0696 (2013.01)
USPC .......................................... 257/591; 257/587

(58) Field of Classification Search
USPC .................... 257/139, 284, 587, 591
See application file for complete search history.

(56) References Cited

U.S. PATENT DOCUMENTS

| 7,800,168 B2 | 9/2010 | Ogura et al. |
| 2003/0075760 A1 | 4/2003 | Osawa |
| 2008/0191238 A1 | 8/2008 | Madathil et al. |
| 2010/0193835 A1 | 8/2010 | Hshieh |

FOREIGN PATENT DOCUMENTS

| EP | 1170803 A2 * | 1/2002 |
| JP | 2001-168333 | 6/2001 |
| JP | 2006-351743 A | 12/2006 |
| JP | 2009-170532 | 7/2009 |
| JP | 2010-114152 | 5/2010 |

OTHER PUBLICATIONS

Shankar Sawant, et al., "Impact of VLSI Design Rules on High Voltage (2000V) IGBTs/ESTs", Proceedings of 1998 International Symposium on Power Semiconductor Devices & ICs, Kyoto, 1998, p. 253 Fig. 1.
B. Jayant Baliga, "Fundamentals of Power Semiconductor Devices", 2008 Springer ISBN 978-0-387-47313-0, Fig. 9.19.
Japanese Office Action dated Nov. 8, 2013, filed in Japanese counterpart Application No. 2010-213221, 10 pages (with translation).

(Continued)

*Primary Examiner* — Mark Tornow
(74) *Attorney, Agent, or Firm* — Patterson & Sheridan, LLP

(57) ABSTRACT

According to one embodiment, a semiconductor device includes a first major electrode, a first semiconductor layer, a first conductivity type base layer, a second conductivity type base layer, a first conductivity type second semiconductor layer, a gate insulating film, a gate electrode, and a second major electrode. The gate insulating film is provided on a side wall of a trench penetrating the second conductivity type base layer to reach the first conductivity type base layer. The gate electrode is provided inside the gate insulating film in the trench. The second major electrode is provided on the second semiconductor layer and electrically connected with the second semiconductor layer. A maximum impurity concentration in the second semiconductor layer is within ten times a maximum impurity concentration in the second conductivity type base layer.

12 Claims, 13 Drawing Sheets

(56) References Cited

OTHER PUBLICATIONS

Japanese Office Action dated Jan. 23, 2013, filed in Japanese counterpart Application No. 2010-213221, 7 pages (in English and Japanese).

Chinese Office Action dated Dec. 2, 2013, filed in Chinese counterpart Application No. 201110265405.4, 9 pages (with translation).
Chinese Office Action dated Aug. 11, 2014, filed in Chinese counterpart Application No. 201110265405.4, 6 pages (with translation).

* cited by examiner

US 8,912,632 B2

SEMICONDUCTOR DEVICE

CROSS-REFERENCE TO RELATED APPLICATION

This application is based upon and claims the benefit of priority from Japanese Patent Application No. 2010-213221, filed on Sep. 24, 2010; the entire contents of which are incorporated herein by reference.

FIELD

Embodiments described herein relate generally to a semiconductor device.

BACKGROUND

In recent years, as a power device having a withstand voltage not less than 600 V, an insulated gate bipolar transistor (IGBT) has been used widely. The IGBT is designed so that an electric current is not saturated and latch-up does not occur in a state where the electric current is caused to flow in the forward direction in a steady state. However, if the electric current concentration is caused at the time of turning off, there is a case where latch-up occurs, resulting in breakage. It is desired to avoid the breakage phenomenon at the time of turning off particularly when reducing the size of a chip and increasing the current density in an attempt to downsize the chip.

DETAILED DESCRIPTION

According to one embodiment, a semiconductor device includes a first major electrode, a first semiconductor layer, a first conductivity type base layer, a second conductivity type base layer, a first conductivity type second semiconductor layer, a gate insulating film, a gate electrode, and a second major electrode. The first semiconductor layer is provided on the first major electrode. The first conductivity type base layer is provided on the first semiconductor layer. The second conductivity type base layer is provided on the first conductivity type base layer. The first conductivity type second semiconductor layer is provided on the second conductivity type base layer. The gate insulating film is provided on a side wall of a trench penetrating the second conductivity type base layer to reach the first conductivity type base layer. The gate electrode is provided inside the gate insulating film in the trench. The second major electrode is provided on the second semiconductor layer and electrically connected with the second semiconductor layer. A maximum impurity concentration in the second semiconductor layer is within ten times a maximum impurity concentration in the second conductivity type base layer.

Figure 15:
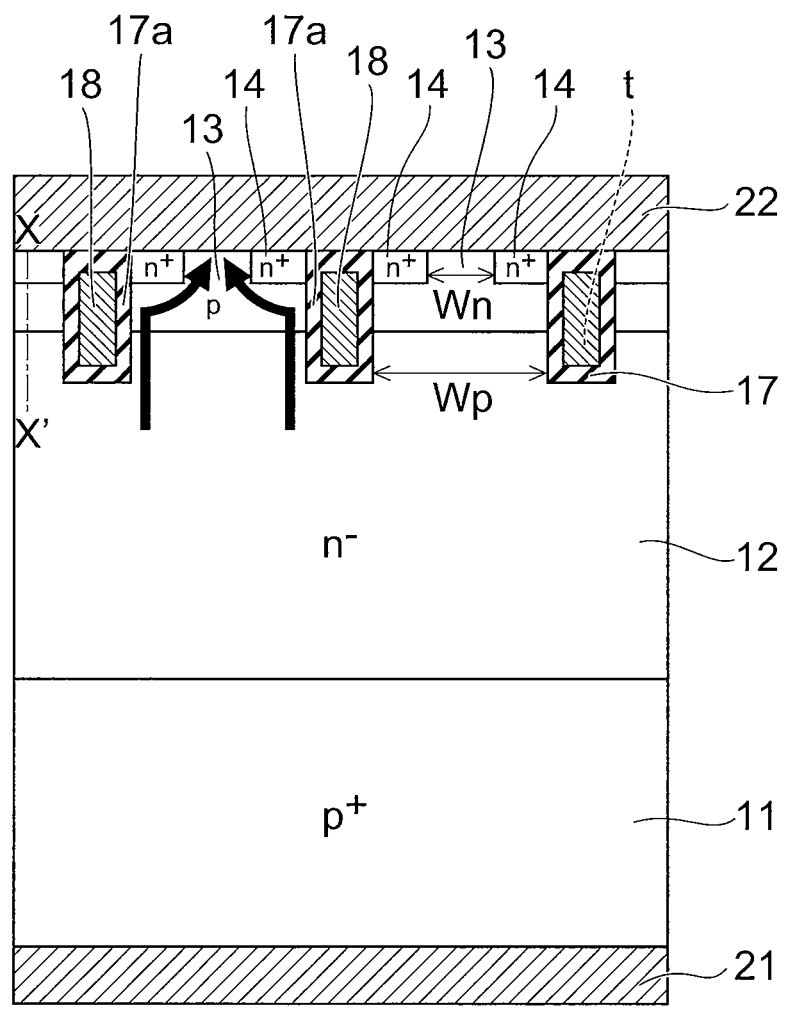
FIG. 15 is a cross-sectional view of a conventional semiconductor device.

FIG. 15 is a cross-sectional view of a conventional trench IGBT.

The IGBT has a pnpn four-layer structure configured by a $p^+$-type collector layer 11, an $n^-$-type base layer 12, a p-type base layer 13, and an $n^+$-type emitter layer 14 and furthermore has a trench structure in which a gate insulating film 17a and a gate electrode 18 are provided in a trench t, a collector electrode 21, and an emitter electrode 22.

A plurality of the trenches t are formed side by side in the lateral direction in a plane pattern in the form of, for example, a stripe. Here, the "lateral direction" is a direction approximately parallel to a major surface of a semiconductor layer (or substrate).

Each trench t penetrates the p-type base layer 13 from the surface of the $n^+$-type emitter layer 14 to thereby reach the $n^-$-type base layer 12. The trench t separates a stacked structure of the p-type base layer 13 and the $n^+$-type emitter layer 14 into a plurality of parts in the lateral direction. The p-type base layer 13 and the $n^+$-type emitter layer 14 are adjacent to the side wall of the trench t.

On the bottom part and the side wall of the trench t, an insulating film 17 is provided. The insulating film of the insulating film 17, which is provided on the side wall of the trench t, is particularly defined as the gate insulating film 17a.

Inside the insulating film 17 in the trench t, the gate electrode 18 is provided. The gate electrode 18 faces the p-type base layer 13 with the gate insulating film 17a interposed. The upper end of the gate electrode 18 is located slightly closer to the side of the $n^+$-type emitter layer 14 than the interface between the p-type base layer 13 and the $n^+$-type emitter layer 14. The lower end of the gate electrode 18 is located closer to the side of the $n^-$-type base layer 12 than the interface between the p-type base layer 13 and the $n^-$-type base layer 12.

On the opposite side of the face of the $p^+$-type collector layer 11, the $n^-$-type base layer 12 being provided on the face, the first major electrode (or collector electrode) 21 is provided. The $p^+$-type collector layer 11 comes into ohmic contact with the first electrode 21 and is electrically connected with the first major electrode 21.

On the p-type base layer 13, the $n^+$-type emitter layer 14, and the trench t, the second major electrode (or emitter electrode) 22 is provided. The second major electrode 22 comes into ohmic contact with the surface of the p-type base layer 13 and the $n^+$-type emitter layer 14 and is electrically connected with the p-type base layer 13 and the $n^+$-type emitter layer 14. Between the gate electrode 18 and the second major electrode 22, the insulating film 17 is interposed.

A part of the gate electrode 18 is led upward and connected with gate wiring, not shown schematically, provided on the trench t. The gate wiring is insulated and isolated from the second major electrode 22 by an insulating layer, not shown schematically.

Figure 16:
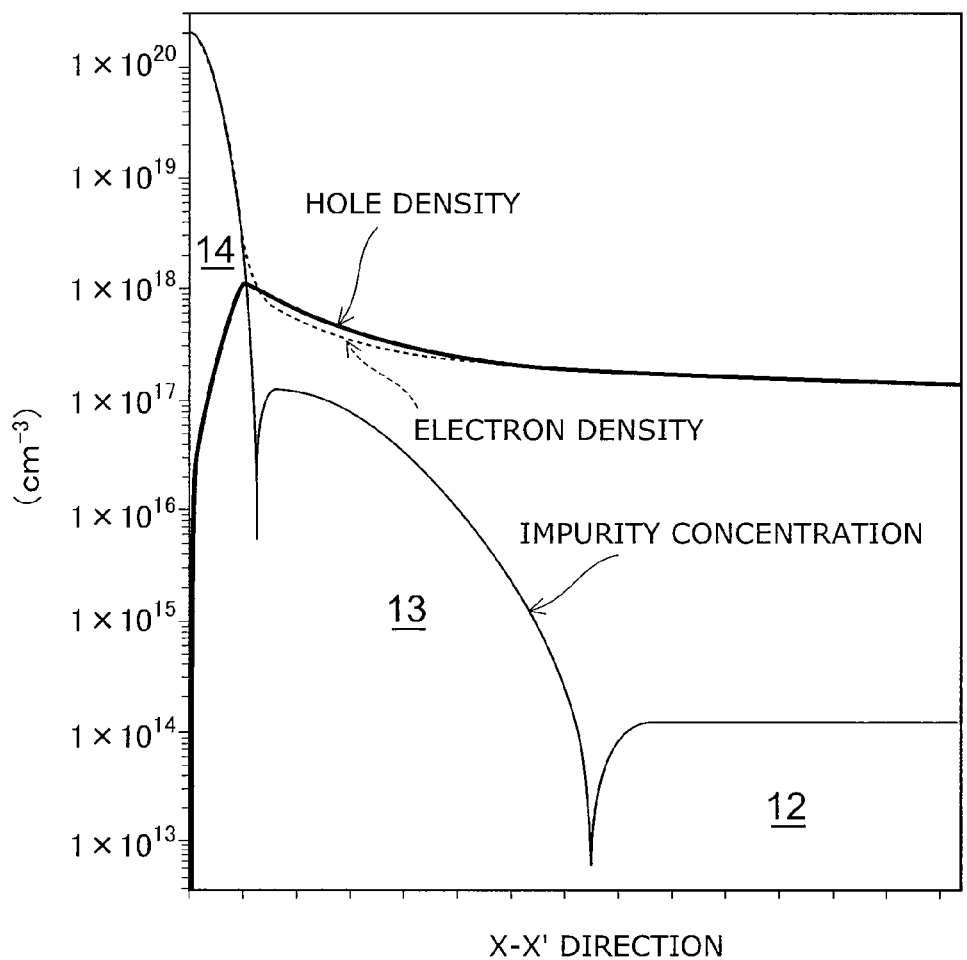
FIG. 16 a distribution chart illustrating an impurity concentration and a carrier density in the maximum electric current flowing state in the conventional semiconductor device.

The impurity concentration in the surface of the $n^+$-type emitter layer 14 required for ohmic contact is equal to or higher than $1 \times 10^{20}$ cm$^{-3}$ as shown in FIG. 16. Therefore, the total amount of impurity (charge) in the $n^+$-type emitter layer 14 is equal to or higher than $1 \times 10^{15}$ cm$^{-2}$.

The maximum impurity concentration in the p-type base layer 13 required for threshold voltage Vth of several volts is about $1 \times 10^{17}$ cm$^{-3}$. Therefore, the total amount of impurity (charge) in the p-type base layer 13 is about $1 \times 10^{13}$ cm$^{-2}$.

The first major electrode 21 and the second major electrode 22 are made up of, for example, a metal material. The gate electrode 18 is made up of a semiconductor material (for example, polycrystal silicon) having a conductivity, to which impurities have been added. Alternatively, as the gate electrode 18, a metal may be used.

In a normal forward conduction state, electrons injected from the $n^+$-type emitter layer 14 flow to the emitter electrode 22 via an n-type inversion layer on the surface of the p-type base layer 13, the $n^-$-type base layer 12, and the $p^+$-type collector layer 11. The n-type inversion layer is a portion of the p-type base layer 13 on the side of the interface with the gate insulating film 17a and hereinafter, referred to as an n channel.

Furthermore, at the same time, holes injected from the $p^+$-type collector layer 11 flow to the emitter electrode 22 via the $n^-$-type base layer 12 and the p-type base layer 13. At this time, the hole current (represented by a thick line arrow in FIG. 15) raises the potential of the p-type base layer 13 and forwardly biases a pn diode configured by the p-type base layer 13 and the $n^+$-type emitter layer 14, and when a threshold voltage of a so-called pn junction is exceeded, electrons do not flow through the n channel and flow to the p-type base layer 13 directly from the $n^+$-type emitter layer 14. This phenomenon is called a latch-up phenomenon and if the phenomenon occurs, the MOS drivability of IGBT is lost, and thus IGBT cannot be turned off, resulting in breakage.

FIG. 16 shows the results of simulation analysis of the electron density and the hole density after latch-up occurs in the conventional IGBT.

As can be seen from the diagram, the characteristic is that the electron density and the hole density are not less than the concentration of impurities in the p-type base layer 13. IGBT having a conventional structure is designed so that when an electric current is caused to flow in the forward direction in a steady state, the electric current is not saturated and latch-up does not occur by narrowing the width of the $n^+$-type emitter layer 14 etc.

However, when turning off a large amount of electric current, there may be a case where the voltage is raised and an avalanche phenomenon occurs. In such a case, it is known that the electric current concentration is generally caused. When the electric current concentration is caused, an electric current several times the amount of the constant current in the forward direction flows in the region where the electric current has been concentrated, and thus latch-up occurs, resulting in breakage. As described above, IGBT having a conventional structure has a problem that breakage is likely to occur when a large amount of electric current is turned off.

If a trench interval Wp is narrowed, the resistance component of the $n^-$-type base layer 12 immediately under the p-type base layer 13 between the trenches t increases and holes are accumulated at that portion, and thus it is possible to reduce the on voltage by the accumulation of holes.

However, if the trench interval Wp is narrowed, a width Wn of a region, in which the p-type base layer 13 contacts the second major electrode 22, is also narrowed. When the width Wn is narrowed, the discharge resistance of holes when avalanche breakdown occurs in the off state increases, causing the reduction in breakdown tolerance. If the trench interval Wp is further narrowed, it becomes difficult to secure the width Wn. Therefore, there have been limitations on miniaturization.

Hereinafter, embodiments will be explained with reference to the drawings. In the drawings, the same numeral is attached to the same component.

In the following embodiments, explanation will be given on the assumption that the first conductivity type is an n type and the second conductivity type a p type, but it may also be possible to set the first conductivity type to a p type and the second conductivity type to an n type.

Furthermore, as a semiconductor, silicon is used. Alternatively, it may also be possible to use a semiconductor other than silicon (for example, a compound semiconductor, such as SiC and GaN).

A semiconductor device according to the following embodiment is a vertical type device in which an electric current path is formed in the vertical direction in which a first major electrode provided on the side of one of major surfaces and a second major electrode provided on the side of the other major surface in a semiconductor layer (or substrate) are connected. However, the embodiment can also be applied to a horizontal type device having a first major electrode and a second major electrode provided on the side of the same major surface of the first major side.

In the following embodiment, as a semiconductor device, examples of an insulated gate bipolar transistor (IGBT) are included, but a metal-oxide-semiconductor field effect transistor (MOSFET) may be used. When MOSFET is used, the $p^+$-type collector layer is replaced with an $n^+$-type drain layer.

First Embodiment

Figure 1:
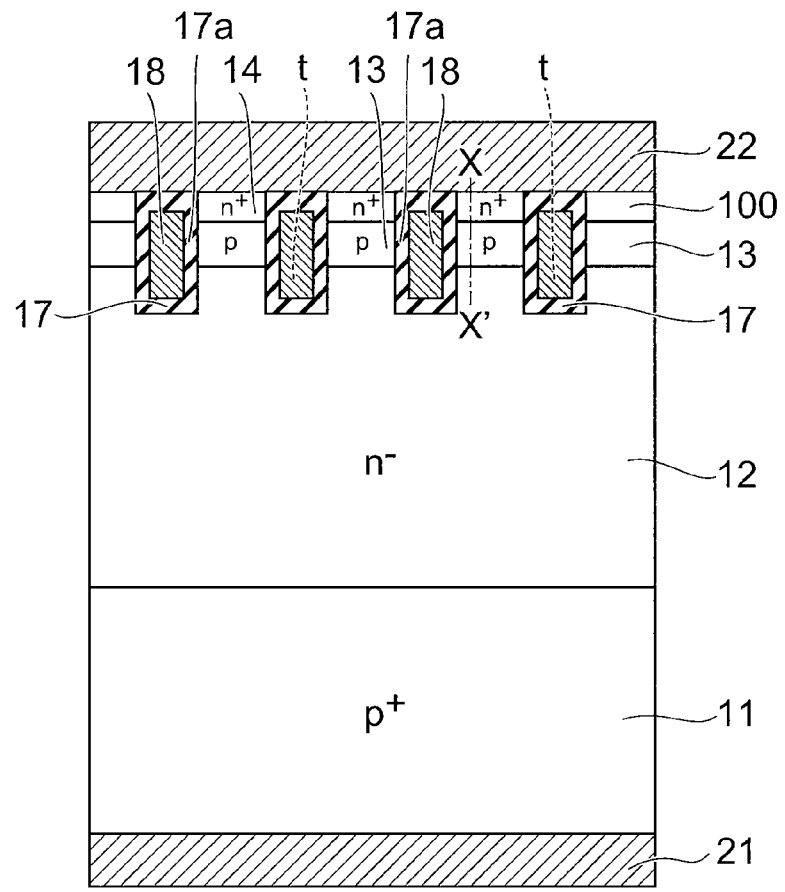
FIG. 1 is a schematic cross-sectional view of a semiconductor device in a first embodiment.

FIG. 1 is a schematic cross-sectional view of a semiconductor device in a first embodiment.

Figure 2:
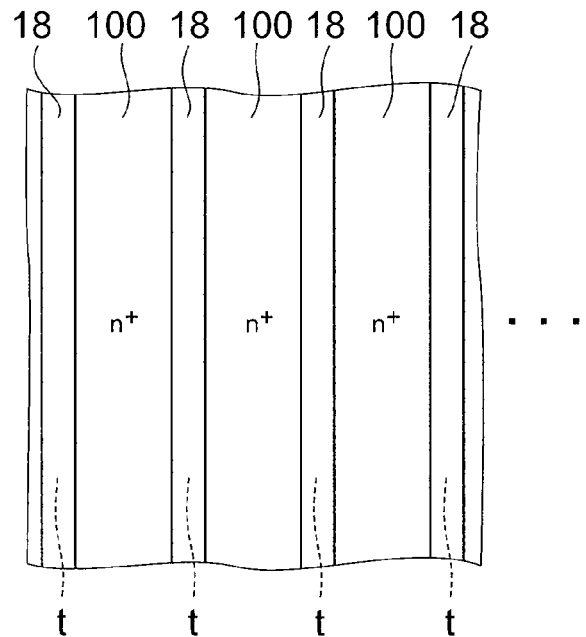
FIG. 2 is a schematic view illustrating a plan layout of essential components in FIG. 1.

FIG. 2 is a schematic view illustrating a plan layout of essential components in the semiconductor device. In each view, the same numeral is attached to the same component in FIG. 15.

The semiconductor layer includes the $p^+$-type collector layer 11, the $n^-$-type base layer 12, the p-type base layer 13, and an $n^+$-type semiconductor layer 100 having an impurity concentration different from the concentration by the conventional technology.

The $n^+$-type semiconductor layer 100 is referred to as an emitter layer in the case of IGBT or a source layer in the case of MOSFET. The emitter layer and the source layer have the same basic function of injecting electrons via an n channel. The $n^+$-type semiconductor layer 100 has an n-type impurity concentration higher than the concentration of the $n^-$-type base layer 12.

The $n^-$-type base layer 12 is provided on the $p^+$-type collector layer 11. The p-type base layer 13 is provided on the $n^-$-type base layer 12. The $n^+$-type semiconductor layer 100 is provided on the p-type base layer 13.

On the side of the surface of those semiconductor layers, a plurality of the trenches t are formed. The plurality of the trenches t are formed side by side in the lateral direction in a plane pattern in the form of, for example, a stripe. Here, the "lateral direction" is a direction approximately parallel to the major surface of the semiconductor layer (or substrate).

Each trench t penetrates the p-type base layer 13 from the surface of the n⁺-type semiconductor layer 14 to thereby reach the n⁻-type base layer 12. The trench t separates a stacked structure of the p-type base layer 13 and the n⁺-type semiconductor 100 into a plurality of parts in the lateral direction. The p-type base layer 13 and the n⁺-type semiconductor layer 100 are adjacent to the side wall of the trench t.

On the bottom part and the side wall of the trench t, the insulating film 17 is provided. The insulating film of the insulating film 17, which is provided on the side wall of the trench t, is particularly defined as the gate insulating film 17a.

Inside the insulating film 17 in the trench t, the gate electrode 18 is provided. The gate electrode 18 faces the p-type base layer 13 with the gate insulating film 17a interposed. The upper end of the gate electrode 18 is located slightly closer to the side of the n⁺-type semiconductor layer 100 than the interface between the p-type base layer 13 and the n⁺-type semiconductor layer 100. The lower end of the gate electrode 18 is located closer to the side of the n⁻-type base layer 12 than the interface between the p-type base layer 13 and the n⁻-type base layer 12.

As shown in FIG. 2, the n⁺-type semiconductor layer 100, the trench t, and the gate electrode 18 are formed in a plane pattern in the form of, for example, a stripe. The p-type base layer 13 is also formed in a plane pattern in the form of a stripe under the n⁺-type semiconductor layer 100. That is, the n⁺-type semiconductor layer 100 is formed in the plane pattern in the form of a stripe, in an overlapping manner, on the p-type base layer 13, the width and length of which are the same as the width and length of the n⁺-type semiconductor layer 100.

On the opposite side of the face of the p⁺-type collector layer 11, on the face the n⁻-type base layer 12 being provided, the first major electrode 21 is provided. The p⁺-type collector layer 11 comes into ohmic contact with the first electrode 21 and is electrically connected with the first major electrode 21.

On the n⁺-type semiconductor layer 100 and the trench t, the second major electrode 22 is provided. The second major electrode 22 comes into ohmic contact with the surface of the n⁺-type semiconductor layer 100 and is electrically connected with the n⁺-type semiconductor layer 100. Between the gate electrode 18 and the second major electrode 22, the insulating film 17 is interposed.

A part of the gate electrode 18 is led upward and connected with gate wiring, not shown schematically, provided on the trench t. The gate wiring is insulated and isolated from the second major electrode 22 by an insulating layer, not shown schematically.

The first major electrode 21 and the second major electrode 22 are made up of, for example, a metal material. The gate electrode 18 is made up of a semiconductor material (for example, polycrystal silicon) having a conductivity, to which impurities have been added. Alternatively, as the gate electrode 18, a metal may be used.

Figure 3:
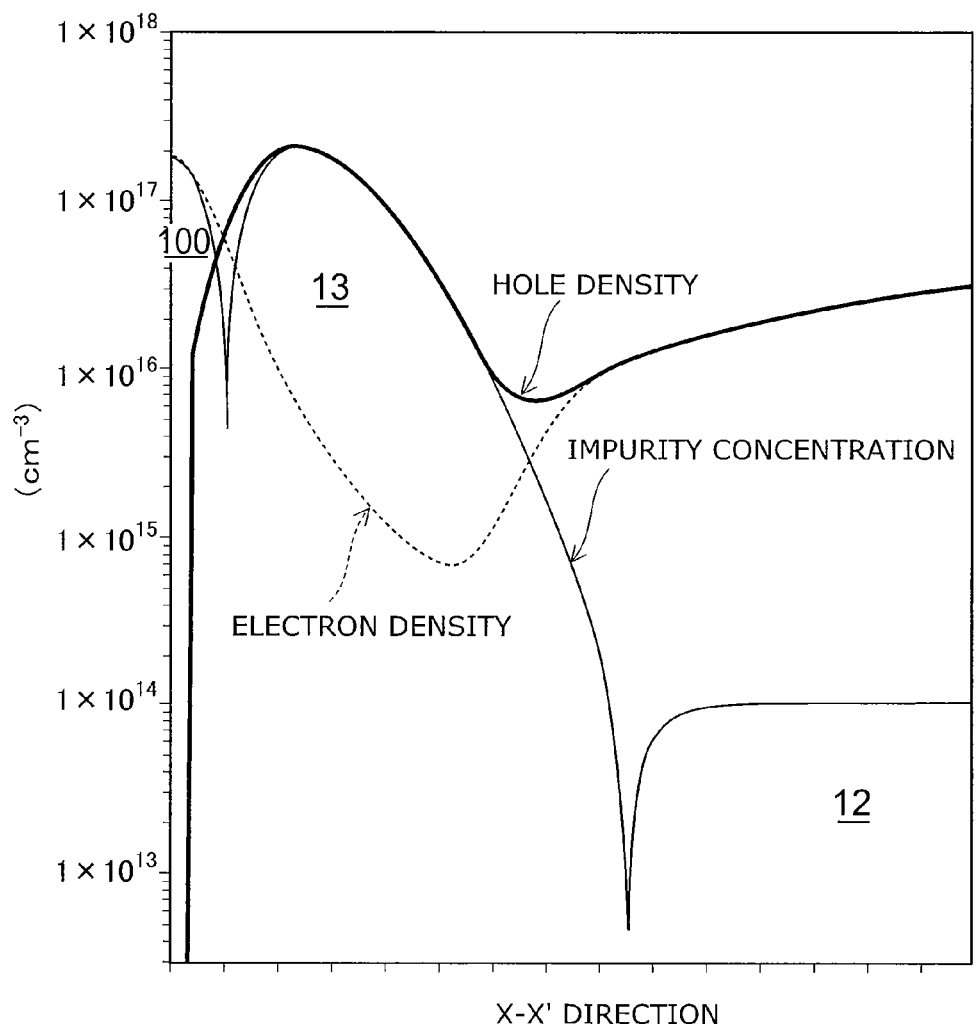
FIGS. 3 and 4 are distribution charts illustrating an impurity concentration and a carrier density in the maximum electric current flowing state in each of embodiments.

FIG. 3 shows an impurity concentration in an X-X' portion in FIG. 1 and the carrier density in the maximum electric current flowing state.

The solid thin line represents an impurity concentration (cm⁻³). It represents an n-type impurity concentration in the n⁺-type semiconductor layer 100 and the n⁻-type base layer 12, and represents a p-type impurity concentration in the p-type base layer 13. The n-type impurity concentration in the n⁺-type semiconductor layer 100 according to the embodiment is characterized by being approximately the same as the p-type impurity concentration in the p-type base layer 13 as shown schematically.

The n-type impurity concentration in the n⁺-type semiconductor layer 100 is at its maximum in the vicinity of the interface between the n⁺-type semiconductor layer 100 and the second major electrode 22. Because of this, the n⁺-type semiconductor layer 100 can come into ohmic contact with the second major electrode 22. Furthermore, the n-type impurity concentration in the n⁺-type semiconductor layer 100 gradually decreases from the interface between the n⁺-type semiconductor layer 100 and the second major electrode 22 to the side of the p-type base layer 13, and reaches its minimum in the vicinity of the interface between the n⁺-type semiconductor layer 100 and the p-type base layer 13.

The p-type impurity concentration in the p-type base layer 13 gradually increases from the interface between the p-type base layer 13 and the n⁺-type semiconductor layer 100 to the side of the n⁻-type base layer 12 to thereby reach its maximum value, and then gradually decreases from the position of the maximum value to the interface between the p-type base layer 13 and the n⁻-type base layer 12 to thereby reach its minimum value in the vicinity of the interface between the p-type base layer 13 and the n⁻-type base layer 12. In the embodiment, the position in which the p-type impurity concentration in the p-type base layer 13 is at its maximum value is closer to the side of the n⁺-type semiconductor layer 100 rather than the n⁻-type base layer 12, but the opposite positional relationship does not cause any problem.

Here, the maximum value of the p-type impurity concentration in the p-type base layer 13 determines a threshold voltage, which is a voltage at which an n channel is formed when a gate voltage is applied, and thus the concentration is set to about 1 to about $3 \times 10^{17}$ (cm⁻³) in order to attain 5 to 15 V, which is a general threshold voltage.

The broken line represents the electron density (cm⁻³) in the maximum current flowing state and the solid thick line represents the hole density (cm⁻³) in the maximum current flowing state. Here, the "maximum current flowing state" represents the on state when the rated maximum current flows in the vertical direction between the first major electrode 21 and the second major electrode 22.

In the embodiment, the n-type impurity concentration in the n⁺-type semiconductor layer 100 is set to a concentration approximately the same as the p-type impurity concentration in the p-type base layer 13, and thus it is possible to prevent the occurrence of latch-up, by which an electric current continues to flow between the first major electrode 21 and the second major electrode 22 even if the gate is turned off.

Specifically, the minority carrier density (electron density) in the p-type base layer 13 in the maximum current flowing state is not more than the p-type impurity concentration in the p-type base layer 13 as shown schematically, and thus latch-up does not occur as is known from a comparison with FIG. 16.

It has also been known that latch-up does not occur similarly when the maximum impurity concentration in the n⁺-type semiconductor layer 100 (the maximum value of the n-type impurity concentration) increases within ten times the maximum impurity concentration in the p-type base layer 13 (the maximum value of the p-type impurity concentration) and the maximum value of the n-type impurity concentration in the n⁺-type semiconductor layer 100 is not more than $1 \times 10^{18}$ cm⁻³.

In the conventional semiconductor device, as previously explained, the maximum impurity concentration in the n⁺-type emitter layer 14 is required for equal to or higher than $1 \times 10^{20}$ cm⁻³ and the maximum impurity concentration in the p-type base layer 13 is required for equal to or higher than $1 \times 10^{17}$ cm⁻³. Therefore, the maximum impurity concentration in the n+-type emitter layer 14 is about a thousand times the maximum impurity concentration in the p-type base layer 13.

This can be explained as follows. First, when the maximum value of the n-type impurity concentration in the n+-type semiconductor layer 100 is the same as or not more than the maximum value of the p-type impurity concentration in the p-type base layer 13, as shown in FIG. 3, the electron density becomes not more than the p-type impurity concentration and latch-up does not occur.

Figure 4:
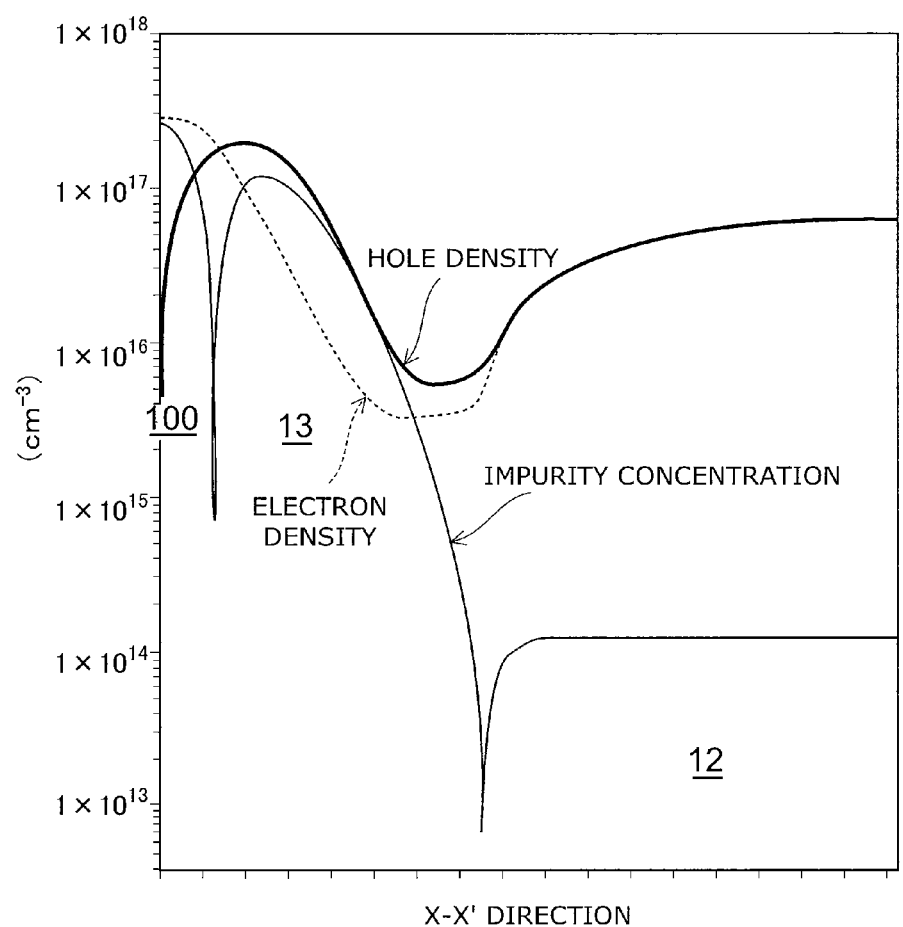

Furthermore, it has been found by the comparison and the examination of the simulation analysis that when the maximum value of the n-type impurity concentration in the n+-type semiconductor layer 100 is within ten times the maximum value of the p-type impurity concentration in the p-type base layer 13, as shown in FIG. 4, the electron density is greater than the maximum value of the p-type impurity concentration in the p-type base layer 13 in the vicinity of the n+-type semiconductor layer 100, but the electron density becomes sufficiently low because of diffusion in the p-type base layer 13 and in the vicinity of the n−-type base layer 12, the electron density becomes not more than the p-type impurity concentration, and latch-up does not occur.

Moreover, it has been possible to know by the simulation analysis that the above applies similarly when the total amount of charge in the n+-type semiconductor layer 100 is within ten times the total amount of charge in the p-type base layer 13, that is, the amount of charge per unit area in the n+-type semiconductor layer 100 is not more than $1 \times 10^{14}$ $cm^{-2}$.

This relationship is one between the n+-type semiconductor layer 100 and the p-type base layer 13, and thus the relationship does not change by the withstand voltage of the element. This is because what changes by the withstand voltage of the element is the width of and the impurity concentration in the n−-type base layer 12.

In the conventional semiconductor device, as previously explained, the total amount of charge in the n+-type emitter layer 14 is required for equal to or higher than $1 \times 10^{15}$ $cm^{-3}$ and the total amount of charge in the p-type base layer 13 is required for equal to or higher than $1 \times 10^{13}$ $cm^{-3}$. Therefore, the total amount of charge in the n+-type emitter layer 14 is about a thousand times the total amount of charge in the p-type base layer 13.

This relationship between the impurity concentration, the carrier density, and the amount of charge also applies to other embodiments, modifications, to be explained later.

In the embodiment, as described above, the design is made so that the electron injection efficiency from the n+-type semiconductor layer 100 is low. That is, the n-type impurity concentration in the n+-type semiconductor layer 100 is set sufficiently low so that the minority carrier (electron) density in the p-type base layer 13 is not more than the p-type impurity concentration in the p-type base layer 13 in a state where a forward bias is applied to the pn junction between the p-type base layer 13 and the n+-type semiconductor layer 100.

Because of this, the injection of electrons into the p-type base layer 13 is suppressed even if holes flow into the n+-type semiconductor layer 100. Due to this, latch-up can be avoided and the switching controllability by the gate electrode 18 is not lost. In the on state, electrons flow through a channel limited to the region in the vicinity of the interface with the gate insulating film 17a in the p-type base layer 13.

The summarized characteristics of the embodiment are that the electron density in the p-type base layer 13 in the maximum current flowing state is not more than the p-type impurity concentration in the p-type base layer 13. The conditions for implementing the above are that the maximum value of the n-type impurity concentration in the n+-type semiconductor layer 100 is from approximately the same as the p-type impurity concentration in the p-type base layer 13 to within ten times the p-type impurity concentration in the p-type base layer 13. Furthermore, in other words, the total amount of charge in the n+-type semiconductor layer 100 is from approximately the same as the total amount of charge in the p-type base layer 13 to within ten times the total amount of charge in the p-type base layer 13. By meeting such conditions, it has been possible to know from the simulation analysis that latch-up can be avoided without having to cause the p-type base layer 13 to contact the second major electrode 22 as shown in FIG. 1.

In order to avoid latch-up more securely, it is more desirable that the maximum value of the n-type impurity concentration in the n+-type semiconductor layer 100 is within five times the maximum value of the p-type impurity concentration in the p-type base layer 13 and that the total amount of charge in the n+-type semiconductor layer 100 is within twice the total amount of charge in the p-type base layer 13.

The lower limit of the maximum value of the n-type impurity concentration in the n+-type semiconductor layer 100, the lower limit of the total amount of charge in the n+-type semiconductor layer 100, and the lower limit of the amount of charge per unit area in the n+-type semiconductor layer 100 are set within a range that meets the conditions under which an electron current can flow through the channel when the gate is turned on.

By reducing the n-type impurity concentration in the n+-type semiconductor layer 100, it is possible for the holes injected into the p-type base layer 13 to flow to the second major electrode 22 via the n+-type semiconductor layer 100. Consequently, latch-up does not occur and breakdown tolerance is not reduced when avalanche breakdown occurs.

As described earlier, in the semiconductor device in the embodiment, it is not necessary to secure a contact between the p-type base layer 13 and the second major electrode 22 between the neighboring trenches t including the region in which the channel is formed. Because of this, it is made possible to narrow the trench interval and to reduce the on resistance (on voltage).

That is, in the embodiment, it is possible to reduce the on resistance without reducing the switching controllability and breakdown tolerance. The semiconductor device in the embodiment having such characteristics is particularly suitable for a power device used for switching.

Figure 5:
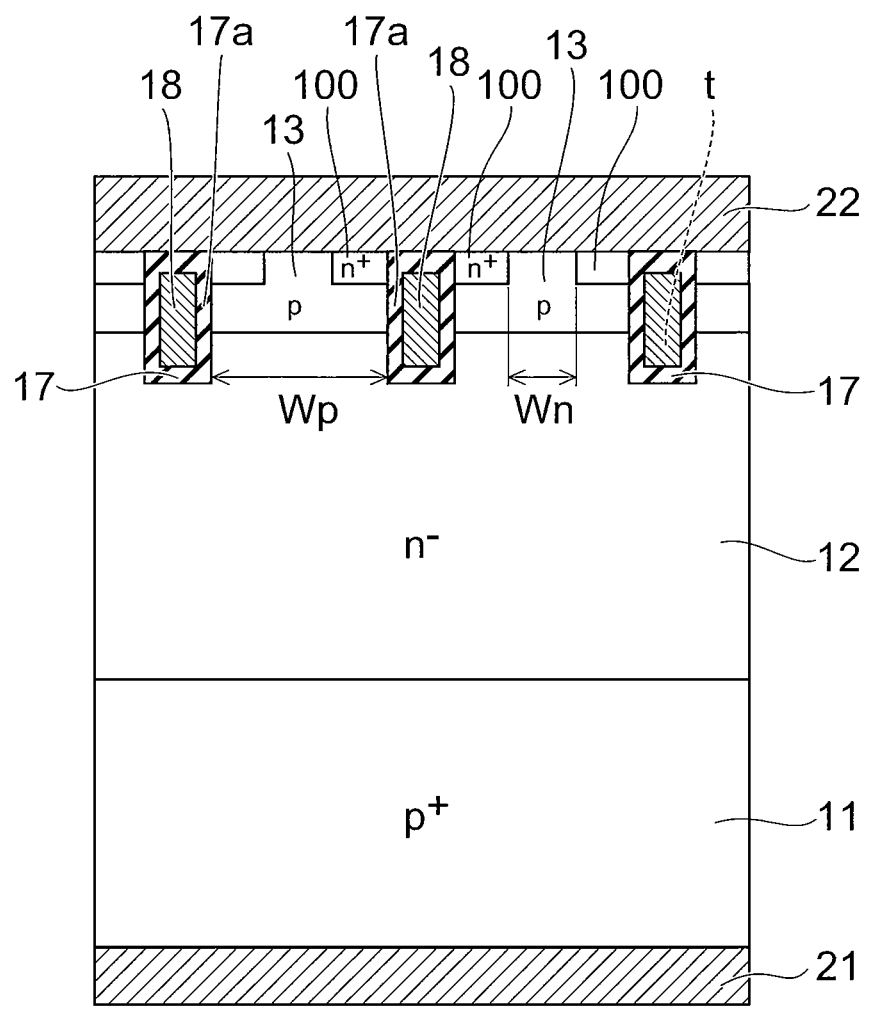
FIG. 5 is a schematic cross-sectional view of another example of the semiconductor device in the first embodiment.

It may also be possible to cause the p-type base layer 13 to contact the second major electrode 22 by exposing a part of the p-type base layer 13 from the n+-type semiconductor layer 100 between the neighboring trenches t as shown in FIG. 5.

In this case, it is possible to cause the avalanche current (hole current) to flow to the second major electrode 22 through the portion where the p-type base layer 13 and the second major electrode 22 contact with each other. Because of this, it is possible to further increase breakdown tolerance. Furthermore, because of this, it is possible to prevent the influence of the unstable potential of the p-type base layer 13 on the gate electrode 18, and thus the switching controllability is not deteriorated.

Second Embodiment

Figure 6:
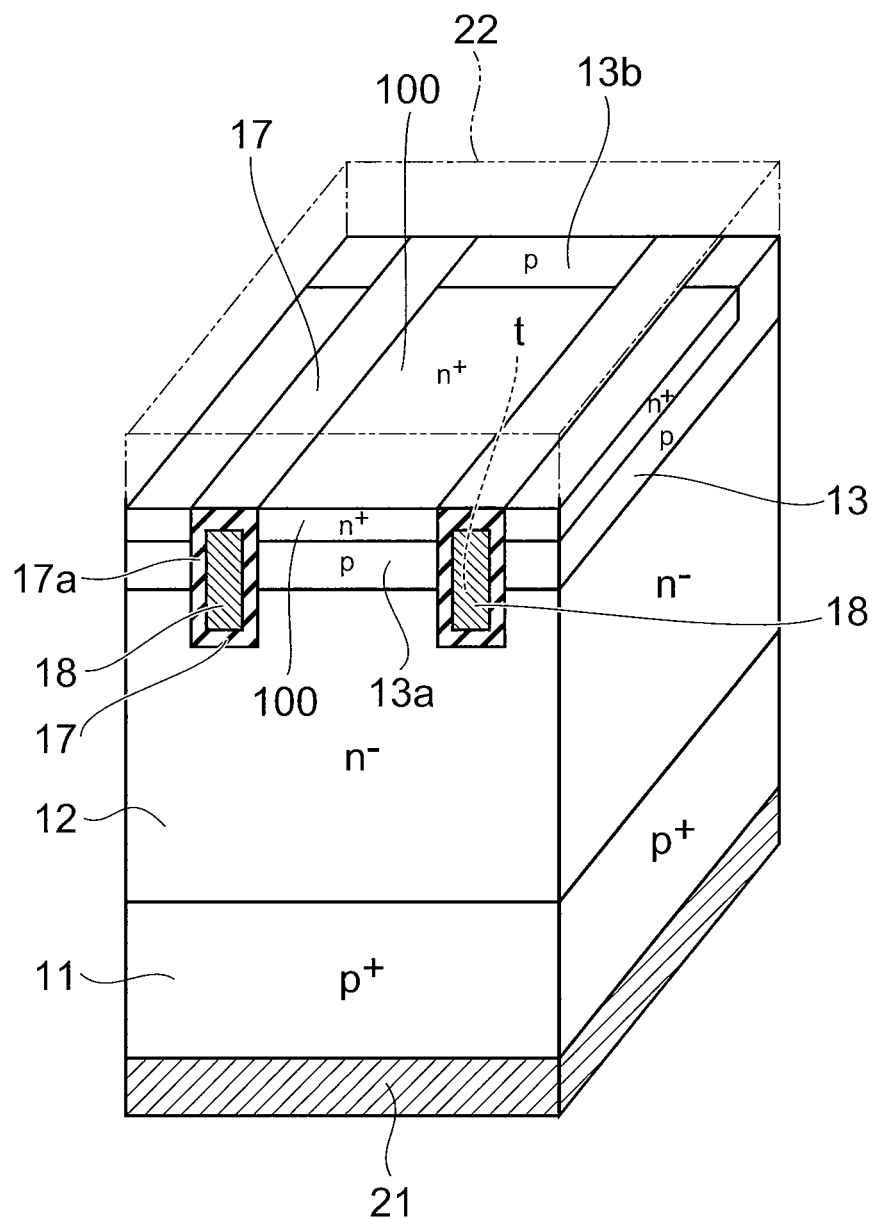
FIG. 6 is a schematic perspective view of a semiconductor device in a second embodiment.

FIG. 6 is a schematic perspective view of a semiconductor device in a second embodiment. In FIG. 6, the second major electrode 22 is shown by the alternate long and two short dashes line in order to make it more visible.

The p-type base layer 13 in the embodiment has a channel region 13a and a contact region 13b. Other configurations and effects that can be obtained are the same as those in the first embodiment described above.

The channel region 13a underlaps directly the $n^+$-type semiconductor layer 100, the width and length of which is the same as the width and length of the channel region 13a. The contact region 13b is not covered with the $n^+$-type semiconductor layer 100 and led upward, and contacts the second major electrode 22.

Therefore, the p-type base layer 13 is given the potential of the second major electrode 22 and it is possible to stabilize the potential of the p-type base layer 13. Because of this, it is possible to prevent the influence of the unstable potential of the p-type base layer 13 on the gate electrode 18, and thus the switching controllability is not deteriorated.

Third Embodiment

Figure 7:
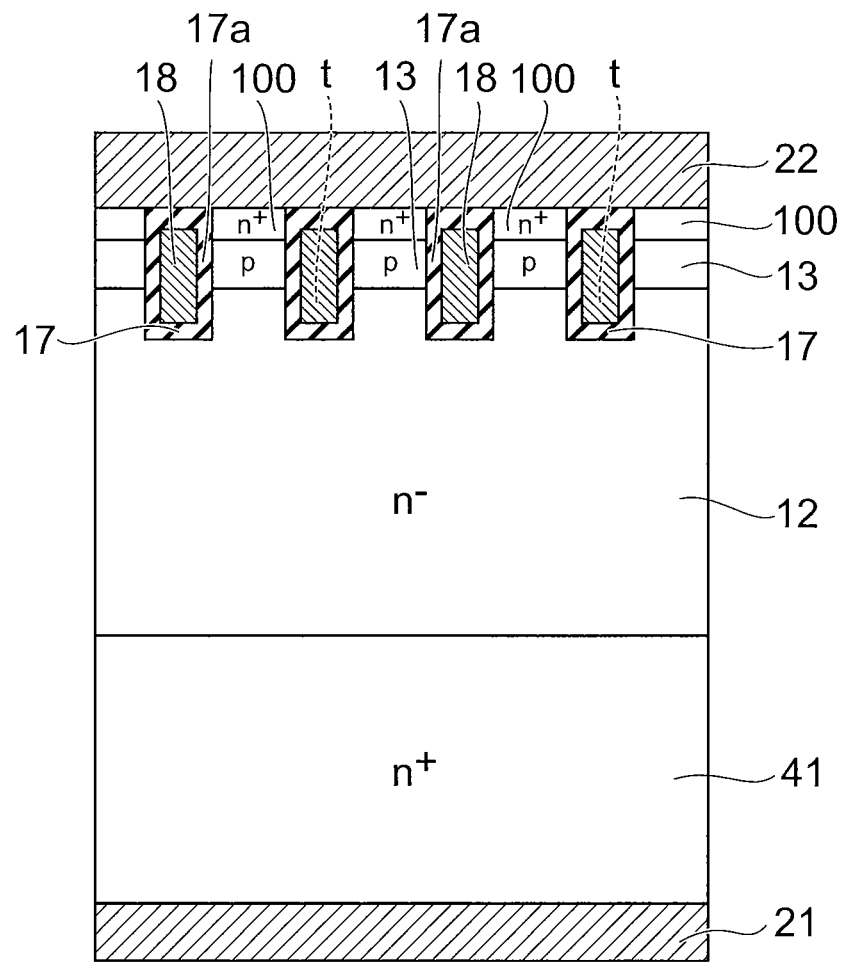
FIG. 7 is a schematic cross-sectional view of a semiconductor device in a third embodiment.

FIG. 7 is a schematic cross-sectional view of a semiconductor device in a third embodiment.

The semiconductor device of the embodiment has a MOSFET structure, a structure in which the $p^+$-type collector layer 11 is replaced with an $n^+$-type drain layer 41 in the semiconductor device of the first embodiment shown in FIG. 1.

In a state where a relatively high potential is applied to the first major electrode 21 and a relatively low potential to the second major electrode 22, if a desired gate potential is applied to the gate electrode 18, an inversion layer (n channel) is formed in the vicinity of the interface with the gate insulating film 17a in the p-type base layer 13. For example, to the second major electrode 22, the ground potential or a negative potential is applied and to the gate electrode 18, a positive gate potential is applied. To the first major electrode 21, a positive potential higher than the gate potential is applied.

Because of this, an electric current flows between the second major electrode 22 and the first major electrode 21 through the $n^+$-type semiconductor layer 100, the n channel, the $n^-$-type base layer 12, and the $n^+$-type drain layer 41 and the on state is brought about.

In the embodiment, as in the first embodiment, the design is made so that the electron injection efficiency from the $n^+$-type semiconductor layer 100 is low. Consequently, holes which are generated by the avalanche breakdown can flow to the second major electrode 22 via the $n^+$-type semiconductor layer 100 without the need to cause the p-type base layer 13 and the second major electrode 22 to come into contact. Therefore, breakdown tolerance is not reduced.

Furthermore, it is not necessary to secure a contact between the p-type base layer 13 and the second major electrode 22, and thus it is made possible to reduce the trench interval and the on resistance can be reduced by the improvement in the channel density.

That is, in the embodiment also, it is possible to reduce the on resistance without reducing the switching controllability and breakdown tolerance.

In the embodiment, it may also be possible to cause the p-type base layer 13 to contact the second major electrode 22 by exposing a part of the p-type base layer 13 from the $n^+$-type semiconductor layer 100 between the neighboring trenches t as shown in FIG. 5. In this case, it is possible to cause the avalanche current (hole current) to flow to the second major electrode 22 through the portion where the p-type base layer 13 and the second major electrode 22 contact with each other. Because of this, it is possible to further increase breakdown tolerance.

Fourth Embodiment

Figure 8:
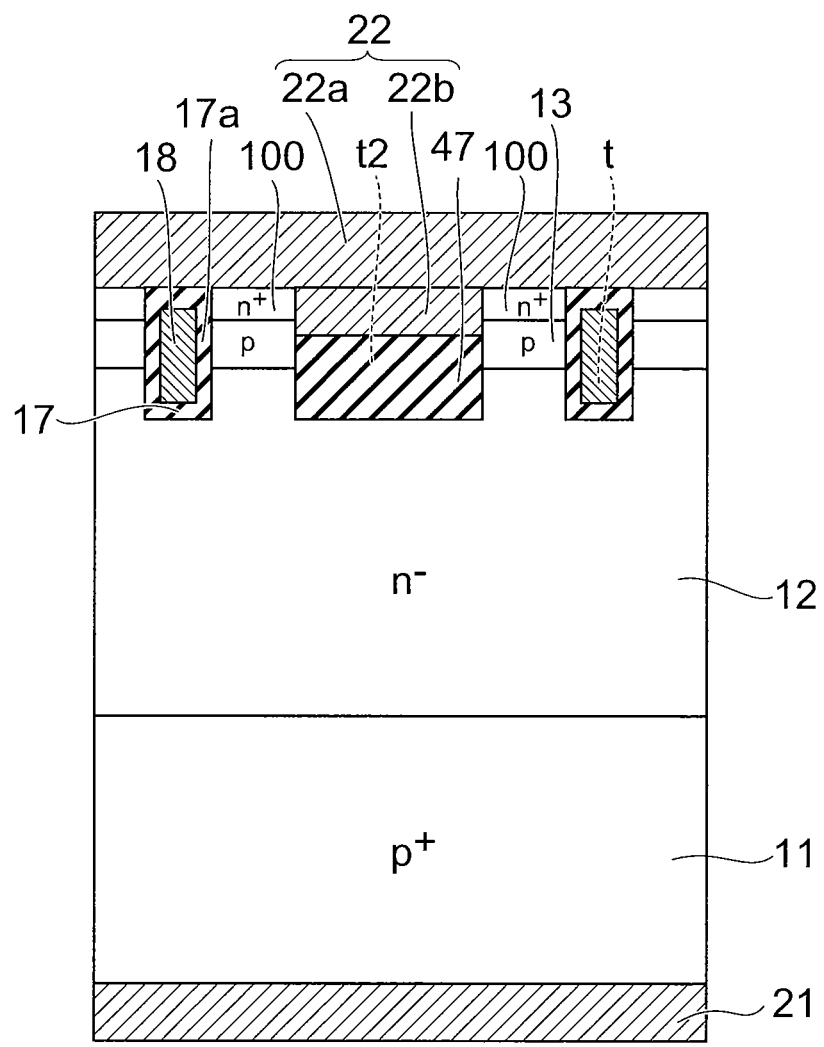
FIG. 8 is a schematic cross-sectional view of a semiconductor device in a fourth embodiment.

FIG. 8 is a schematic cross-sectional view of a semiconductor device in a fourth embodiment.

The semiconductor device in the embodiment has an insulating layer 47 provided in a second trench t2 and an buried electrode 22b. Other configurations are the same as those in the first embodiment described above.

The second trench t2 is provided between the trenches t in which the gate electrode 18 is provided. The second trench t2 penetrates the p-type base layer 13 from the surface of the $n^+$-type semiconductor layer 100 to thereby reach the $n^-$-type base layer 12. The second trench t2 separates the stacked structure of the p-type base layer 13 and the $n^+$-type semiconductor layer 100 into a plurality of parts in the lateral direction. The p-type base layer 13 and the $n^+$-type semiconductor layer 100 are adjacent to the side wall of the second trench t2.

The second major electrode 22 has a surface electrode 22a and the buried electrode 22b. In the second trench t2, the buried electrode 22b and the insulating layer 47 are buried.

The surface electrode 22a is provided on the $n^+$-type semiconductor layer 100 and contacts the top face of the $n^+$-type semiconductor layer 100. Furthermore, the surface electrode 22a is provided also on the trench t and the second trench t2. Between the surface electrode 22a and the gate electrode 18, the insulating film 17 is interposed and the surface electrode 22a and the gate electrode 18 are not connected.

The buried electrode 22b is provided on the top part of the second trench t2 and connected with the surface electrode 22a. The buried electrode 22b is made up of a semiconductor material (for example, polycrystal silicon) having a conductivity, to which impurities have been added. Alternatively, as the buried electrode 22b, a metal may be used.

The bottom part of the buried electrode 22b crosses the interface between the $n^+$-type semiconductor layer 100 and the p-type base layer 13 to thereby reach the p-type base layer 13. The buried electrode 22b neighbors the side face of the $n^+$-type semiconductor layer 100 and the side face of the p-type base layer 13. That is, the side face of the buried electrode 22b neighbors the entire side face of the $n^+$-type semiconductor layer 100 and a part of the side face of the p-type base layer 13. Because of this, the $n^+$-type semiconductor layer 100 and the p-type base layer 13 are electrically connected with the second major electrode 22 via the buried electrode 22b.

The insulating layer 47 is provided under the buried electrode 22b in the second trench t2.

In the embodiment, by providing the second trench t2 between the trench t and the trench t, the width of the p-type base layer 13 can be narrowed. When the width of the p-type base layer 13 is narrowed, the resistance component of the $n^-$-type base layer 12 immediately under the p-type base layer 13 increases and holes are accumulated at the portion. The accumulation of holes promotes injection of electrons into the $n^-$-type base layer 12, and thus the on resistance (on voltage) can be reduced.

No gate electrode is provided in the second trench t2. Consequently, at the portion of the p-type base layer 13, which neighbors the second trench t2, no channel is formed. That is, in the embodiment, even if the width of the p-type base layer 13 is narrowed, the channel density and the gate capacity are not increased. Because of this, it is possible to reduce the on voltage without reducing the switching rate.

Furthermore, in the embodiment also, as in the first embodiment described above, it is possible to avoid latch-up by reducing the electron injection efficiency from the $n^+$-type semiconductor layer 100 without the need to secure a contact between the top face of the p-type base layer 13 and the second major electrode 22. In addition, breakdown tolerance is not reduced.

Moreover, in the embodiment, a part of the side face of the p-type base layer 13 is in contact with the buried electrode 22b, which is a part of the second major electrode 22. Because of this, holes can flow to the second major electrode 22 through part of the side face of the p-type base layer 13. Therefore, it is possible to suppress the injection of holes into the n$^+$-type semiconductor layer 100 in the on state and latch-up becomes more difficult to occur. Furthermore, it is also possible for the avalanche current (hole current) to flow to the second major electrode 22 through a part of the side face of the p-type base layer 13, and thus a higher breakdown tolerance can be obtained.

That is, in the embodiment also, it is possible to reduce the on resistance without reducing the switching controllability or breakdown tolerance.

Furthermore, the second major electrode 22 is in contact with the entire top face and the entire side face of the n$^+$-type semiconductor layer 100. Because of this, it is possible to secure a sufficient contact area between the second major electrode 22 and the n$^+$-type semiconductor layer 100 even through miniaturization and the contact resistance is not increased.

Fifth Embodiment

Figure 9:
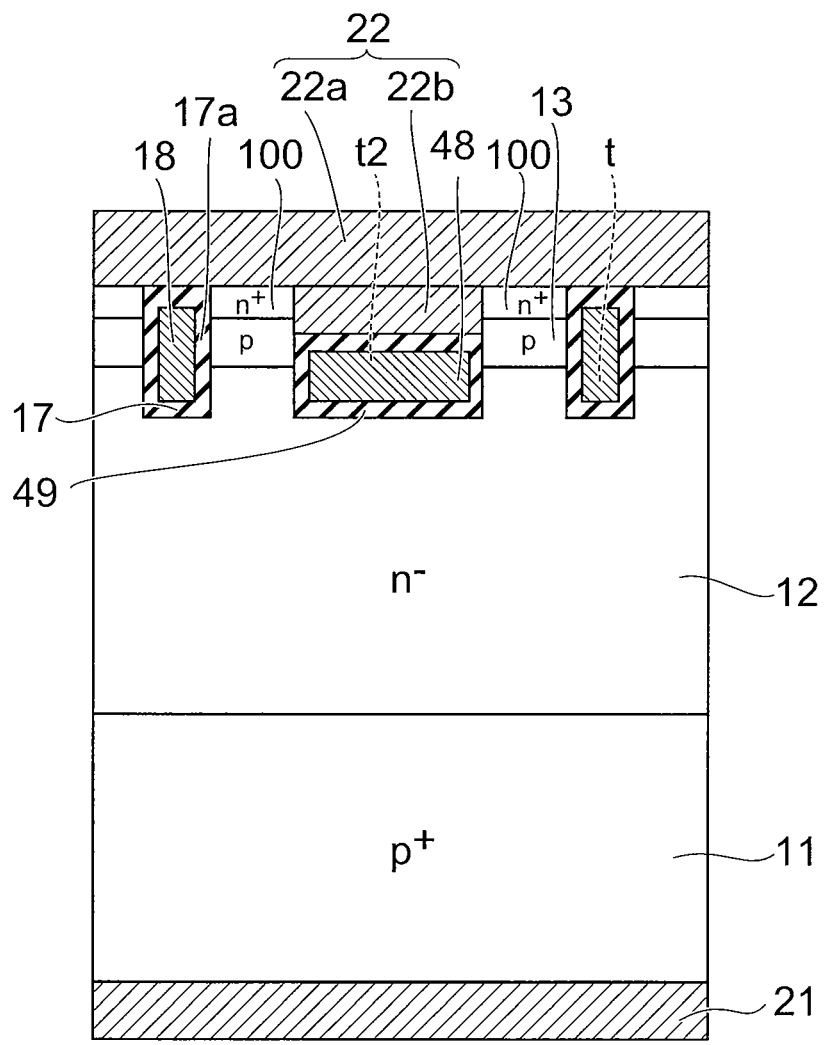
FIG. 9 is a schematic cross-sectional view of a semiconductor device in a fifth embodiment.

FIG. 9 is a schematic cross-sectional view of a semiconductor device in a fifth embodiment.

The embodiment differs from the semiconductor device in the fourth embodiment shown in FIG. 8 in that a conductive material 48 is buried under the buried electrode 22b in the second trench t2. The structure of other portions and the effects that can be obtained are the same as those of the semiconductor device in the fourth embodiment.

Between the conductive material 48 and the bottom part of the second trench t2, an insulating film 49 is provided. Consequently, the conductive material 48 and the n$^-$-type base layer 12 are not in contact. Between the conductive material 48 and the side face of the p-type base layer 13 also, the insulating film 49 is provided. Consequently, the conductive material 48 and the p-type base layer 13 are not in contact. Also between the conductive material 48 and the buried electrode 22b also, the insulating film 49 is provided. Consequently, the conductive material 48 and the buried electrode 22b are not in contact. The conductive material 48 is not also connected with the gate electrode 18. Consequently, the conductive material 48 is in an electrically floating state.

The trench t and the second trench t2 are formed at the same time by, for example, the reactive ion etching (RIE) method using a mask, not shown schematically. The insulating film 17 and the insulating film 49 are formed at the same time by the same material. Then, the material of the conductive material 48 is the same as the material of the gate electrode 18 and when the gate electrode 18 is formed, the conductive material 48 is formed at the same time. Consequently, it is possible to manufacture them efficiently.

Although not shown schematically, it is obvious that the same effects can be obtained even by a structure in which the conductive material 48 inside the second trench t2 is removed and the insulating film 49 is provided.

Sixth Embodiment

Figure 10:
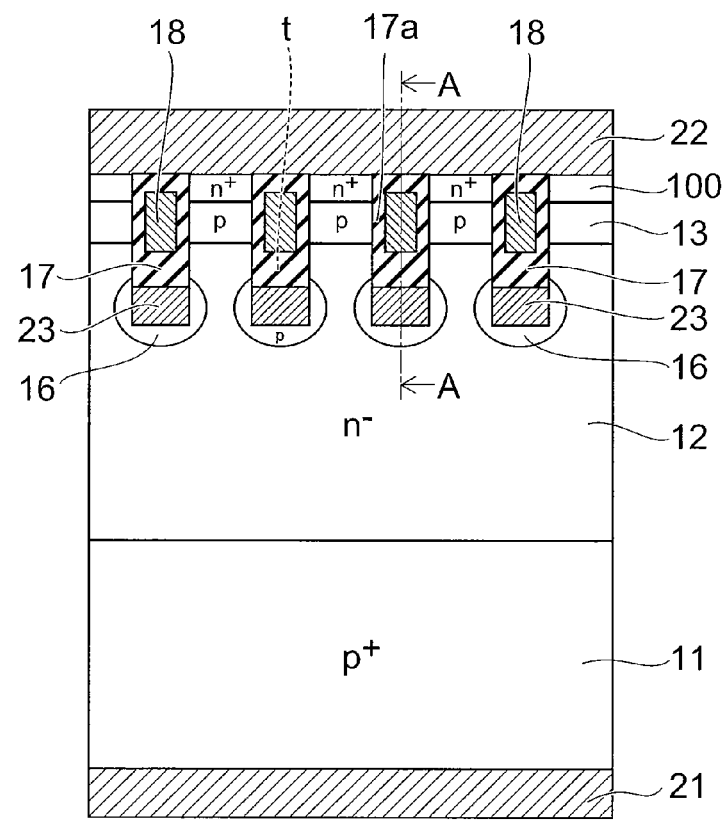
FIG. 10 is a schematic cross-sectional view of a semiconductor device in a sixth embodiment.

FIG. 10 is a schematic cross-sectional view of a semiconductor device in a sixth embodiment.

Figure 11:
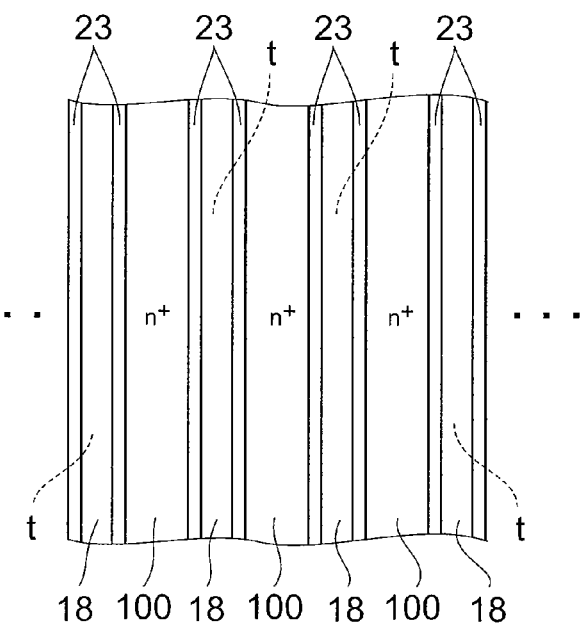
FIG. 11 is a schematic view illustrating a plan layout of essential components in FIG. 10.

FIG. 11 is a schematic view illustrating a plan layout of essential components in the semiconductor device.

Figure 12:
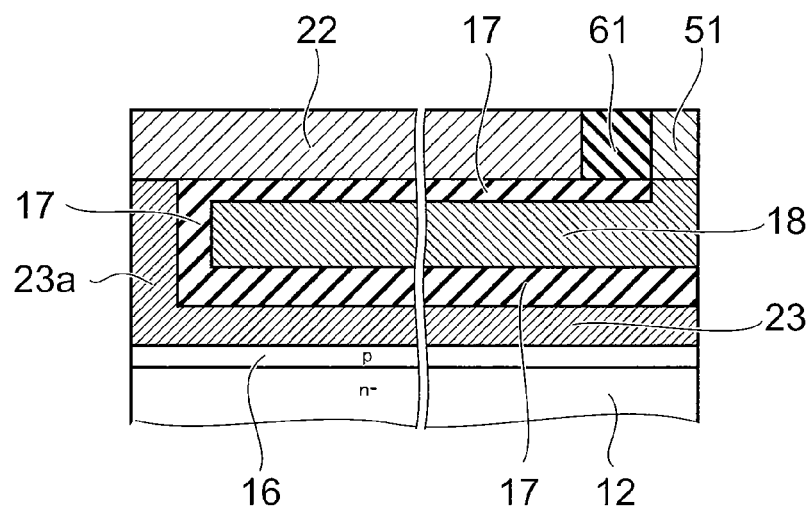
FIG. 12 is an A-A section view in FIG. 11.

FIG. 12 is an A-A section view in FIG. 11.

The semiconductor device in the embodiment further has an buried layer 16 and an buried electrode 23 in addition to the structure in the first embodiment.

A plurality of the buried layers 16 are provided selectively in the n$^-$-type base layer 12.

The trench t penetrates the p-type base layer 13 from the surface of the n$^+$-type semiconductor layer 100 to thereby reach the buried layer 16. The buried layer 16 is provided around the bottom part of the trench t. That is, the buried layer 16 is adjacent to the bottom face of the trench t and the side wall near the bottom face.

On the bottom part of the trench t, the buried electrode 23 is provided. The buried electrode 23 is made up of a semiconductor material (for example, polycrystal silicon) having a conductivity, to which impurities have been added. Alternatively, as the buried electrode 23, a metal may be used.

The bottom face and the side face of the buried electrode 23 are in ohmic contact with the buried layer 16. The buried electrode 23 is provided lower than the gate electrode 18. Between the gate electrode 18 and the buried electrode 23, the insulating film 17 is interposed.

As shown in FIG. 11, the trench t, the n$^+$-type semiconductor layer 100, and the gate electrode 18 are formed in the plane pattern in the form of, for example, a stripe. The p-type base layer 13 is also formed in the plane pattern in the form of a stripe under the n$^+$-type semiconductor layer 100. That is, the n$^+$-type semiconductor layer 100 is formed in the plane pattern in the form of a stripe, in an overlapping manner, on the p-type base layer 13, the width of which is the same as the width of the n$^+$-type semiconductor layer 100.

As shown in FIG. 12, a part 23a of the buried electrode 23 is led upward and connected with the second major electrode 22. At a portion in the trench t, the gate electrode 18 is not provided. At that portion, the part 23a of the buried electrode 23 extends in the trench t in the direction of the width. Through the part 23a, the buried electrode 23 is electrically connected with the second major electrode 22. Consequently, the buried layer 16 coming into ohmic contact with the buried electrode 23 is electrically connected with the second major electrode 22 through the buried electrode 23.

Furthermore, a part of the gate electrode 18 is led upward and connected with gate wiring 51 provided on the trench t. The gate wiring 51 is insulated and isolated from the second major electrode 22 by an insulating layer 61.

In the semiconductor device of the embodiment, if avalanche breakdown occurs, the hole current flows to the second major electrode 22 via the p-type buried layer 16 and the buried electrode 23 coming into ohmic contact with the buried layer 16. Because of this, device destruction can be avoided.

In a power device with a trench gate structure, the electric field is likely to become high particularly in the vicinity of the bottom part of the trench and avalanche breakdown is likely to occur in the vicinity of the trench bottom part. In the embodiment, the buried layer 16 is provided around the bottom part of the trench t, and thus the destruction phenomenon can be suppressed effectively.

Furthermore, as in the first embodiment, the design is made so that the electron injection efficiency from the n$^+$-type semiconductor layer 100 is low. Because of this, even if holes flow into the n$^+$-type semiconductor layer 100 in the on position, the injection of electrons into the p-type base layer 13 is suppressed. Therefore, latch-up can be avoided and the switching controllability by the gate electrode 18 is not lost.

In the embodiment, even if the contact between the p-type base layer 13 and the second major electrode 22 is not secured between the trenches t, latch-up does not occur and breakdown tolerance is not reduced. Because of this, it is made possible to narrow the trench interval and the on resistance (on voltage) can be reduced.

That is, in the embodiment also, the on resistance can be reduced without reducing the switching controllability and breakdown tolerance.

It is possible to form the trench structure in the embodiment, for example, as follows.

For example, after forming the trench t first, p-type impurities are injected into the bottom part of the trench t. After that, thermal processing is performed to diffuse the injected p-type impurities. Because of this, the buried layer 16 is formed. It may also be possible to perform thermal processing after forming the buried electrode 23, the insulating film 17, and the gate electrode 18.

After injecting p-type impurities into the bottom part of the trench t, the buried electrode 23 is buried into the bottom part of the trench t. Then, the insulating film 17 is formed on the buried electrode 23 and the on the side wall of the trench t. After that, the gate electrode 18 is buried inside the insulating film 17.

Seventh Embodiment

Figure 13:
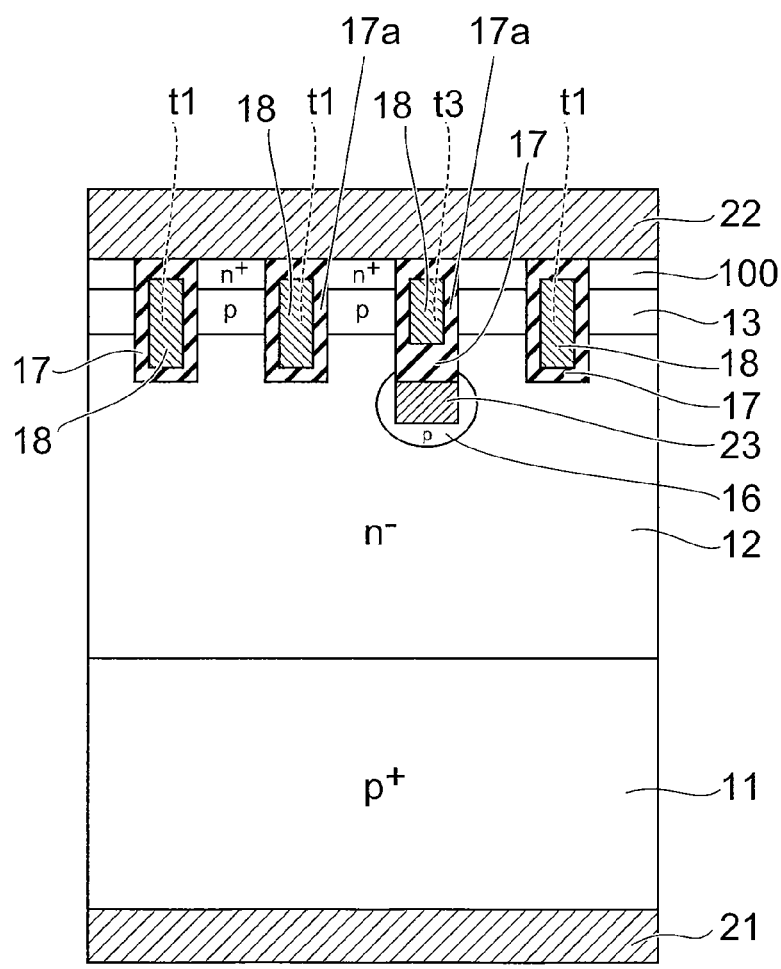
FIG. 13 is a schematic cross-sectional view of a semiconductor device in a seventh embodiment.

As shown in FIG. 13, it is not necessary to provide the buried electrode 23 in all the trenches. In FIG. 13, a plurality of the trenches are shown by being divided into the first trench t1 and a second trench t3.

The first trench t1 penetrates the p-type base layer 13 from the surface of the $n^+$-type semiconductor layer 100 to thereby reach the $n^-$-type base layer 12. On the bottom part and the side wall of the first trench t, the insulating film 17 is formed. Inside the insulating film 17, the gate electrode 18 is buried. The gate electrode 18 faces the p-type base layer 13 via the gate insulating film 17a formed on the side wall of the first trench t1.

The second trench t3 also penetrates the p-type base layer 13 from the surface of the $n^+$-type semiconductor layer 100 to thereby reach the $n^-$-type base layer 12. The second trench t3 is deeper than the first trench t1.

In the $n^-$-type base layer 12, the buried layer 16 is provided selectively. The buried layer 16 is not provided around the bottom part of the first trench t1. The bottom part of the second trench t3 reaches the buried layer 16. That is, the buried layer 16 is adjacent to the bottom face of the second trench t3 and the side wall near the bottom face.

On the bottom part of the second trench t3, the buried electrode 23 is provided. The bottom face and the side face of the buried electrode 23 are in ohmic contact with the buried layer 16.

On the buried electrode 23 in the second trench t3, the gate electrode 18 is provided via the insulating film 17. On the side wall of the second trench t3 upper than the buried electrode 23, the gate insulating film 17a is formed. The gate electrode 18 in the second trench t3 faces the p-type base layer 13 with the gate insulating film 17a interposed.

As in the sixth embodiment, a part of the buried electrode 23 is led upward and connected with the second major electrode 22. Consequently, the buried layer 16 coming into ohmic contact with the buried electrode 23 is electrically connected with the second major electrode 22 through the buried electrode 23.

Consequently, the avalanche current (hole current) flows to the second major electrode 22 via the p-type buried layer 16 and the buried electrode 23 coming into ohmic contact with the buried layer 16. Because of this, device destruction can be avoided.

By making the second trench t3 deeper than the first trench t1, it is possible to provide the buried layer 16 and the buried electrode 23 in a position deeper than the first trench t1. Because of this, it is possible to cause the avalanche current (hole current) that is likely to occur in the vicinity of the trench bottom part to flow to the second major electrode 22 effectively via the buried layer 16 and the buried electrode 23.

In a structure in which the buried layer 16 is provided in both the neighboring trenches, if the interval between the neighboring buried layers 16 is narrowed or the neighboring buried layers 16 stick to each other, the flow of electrons in the longitudinal direction in the on state is impeded.

In the embodiment, the buried layer 16 and the buried electrode 23 are not provided corresponding to all the trenches and are provided only on the bottom part of a selected specific trench (the second trench t3). Consequently, the design is possible, in which the buried layer 16 is not formed in both the neighboring trenches. Because of this, it is made possible to narrow the trench interval without impeding the flow of electrons in the longitudinal direction. By narrowing the trench interval, it is possible to reduce the on resistance (on voltage).

Eighth Embodiment

Figure 14:
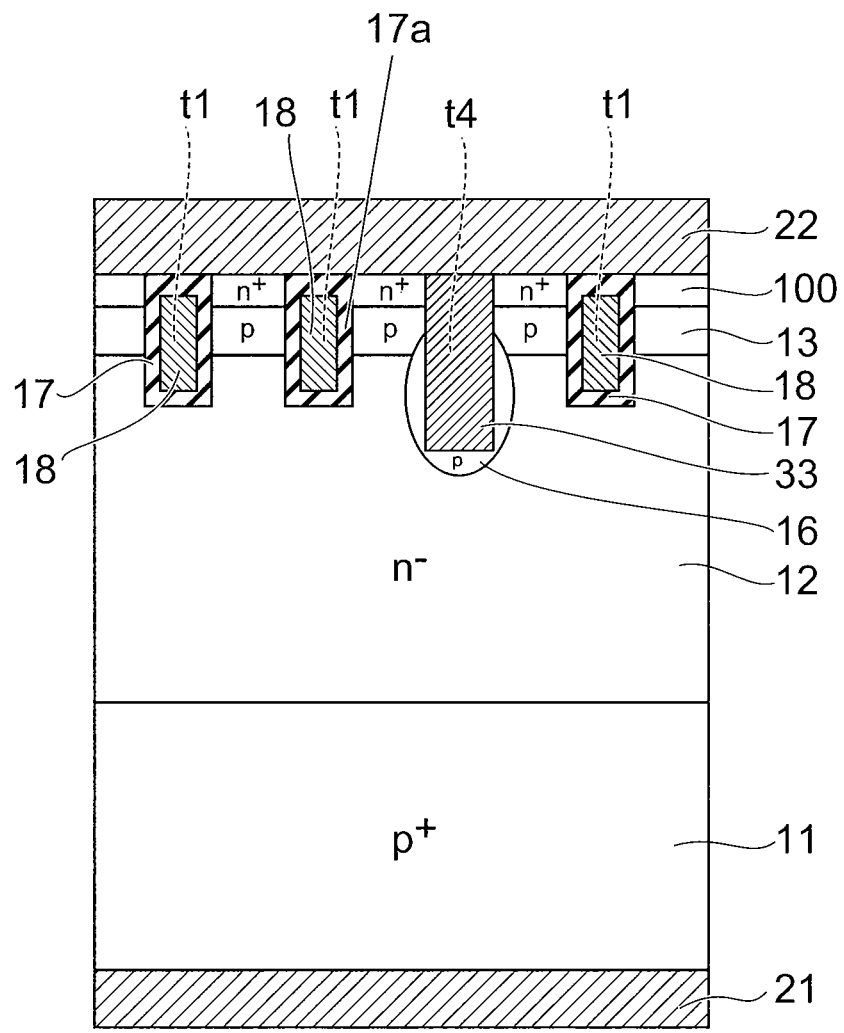
FIG. 14 is a schematic cross-sectional view of a semiconductor device in an eighth embodiment.

Next, FIG. 14 is a schematic cross-sectional view of a semiconductor device in an eighth embodiment.

In the embodiment also, the buried layer 16 and an buried electrode 33 are not provided in all the trenches. In FIG. 14, the plurality of trenches are shown divided into the first trench t1 and a second trench t4.

The second trench t4 also penetrates the p-type base layer 13 from the surface of the $n^+$-type semiconductor layer 100 to thereby reach the $n^-$-type base layer 12. In the case where the second trench t4 is deeper than the first trench t1, the holes at avalanche breakdown can be effectively discharged into the second major electrode 22. However, in the case where the second trench t4 is not deeper than the first trench t1, some holes at avalanche breakdown can be discharged into the second major electrode 22.

In the $n^-$-type base layer 12, the buried layer 16 is provided selectively. The buried layer 16 is not provided around the bottom part of the first trench t1. The bottom part of the second trench t4 reaches the buried layer 16. The buried layer 16 is adjacent to the bottom face of the second trench t4. The buried layer 16 is adjacent to the side wall lower than the p-type base layer 13 in the second trench t4.

In the second trench t4, the buried electrode 33 is provided. The buried electrode 33 is filled in the second trench t4 from the bottom part up to the opening. The bottom face and the side face of the buried electrode 33 are in ohmic contact with the buried layer 16. The buried electrode 33 is made up of a semiconductor material (for example, polycrystal silicon) having a conductivity, to which impurities have been added, or a metal material.

The second major electrode 22 is provided also on the second trench t4 and is in contact with the upper end of the buried electrode 33 which is filled within the second trench t4. The buried layer 16 coming into ohmic contact with the buried electrode 33 is electrically connected with the second major electrode 22 through the buried electrode 33.

The gate electrode 18 is not provided in the second trench t4. The side faces of the $n^+$-type semiconductor layer 100 and the p-type base layer 13 neighboring the second trench t4 are in contact with the side face of the buried electrode 33, respectively.

In the embodiment also, the avalanche current (hole current) flows to the second major electrode 22 via the p-type buried layer 16 and the buried electrode 33 coming into ohmic contact with the buried layer 16. Because of this, device destruction can be avoided. Furthermore, the side face of the p-type base layer 13 is in contact with the buried electrode 33, and thus the avalanche current (hole current) can flow to the second major electrode 22 via the p-type base layer 13 and the buried electrode 33. Because of this, a higher breakdown tolerance can be obtained.

The buried layer 16 and the buried electrode 33 are not provided corresponding to all the trenches, but is provided only in a selected specific trench (the second trench t4). Consequently, the design is possible, in which the buried layer 16 is not formed in both the neighboring trenches. Because of this, it becomes possible to narrow the trench interval without impeding the flow of electrons in the longitudinal direction. By narrowing the trench interval, the on resistance (on voltage) can be reduced.

It may also be possible to replace the p⁺-type collector layer 11 in the semiconductor device of the sixth to eighth embodiments shown in FIGS. 10 to 14 with an n⁺-type drain layer. That is, in the vertical MOSFET, by providing the buried layer and the buried electrode shown in the sixth to eighth embodiments, it is possible to cause a high breakdown tolerance and a low on resistance to coexist.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device comprising:
   a first electrode;
   a first base layer provided on the first electrode and having a first conductivity type;
   a second base layer provided on the first conductivity type base layer and having a second conductivity type;
   a first semiconductor layer provided on the second conductivity type base layer and having the first conductivity type;
   a gate electrode having a first end at a first level that is closer to a first interface between the first semiconductor layer and the second base layer than to a second interface between the first base layer and the second base layer, and a second end at a second level that is closer to the second interface than to the first interface;
   a gate insulating film provided between the gate electrode and the second base layer; and
   a second electrode provided on the first semiconductor layer and electrically connected to the first semiconductor layer,
   wherein an impurity concentration in the first semiconductor layer is such that a concentration of minority carriers in the second base layer is not greater than an impurity concentration in the second base layer when a forward bias is applied across a pn junction between the second base layer and the first semiconductor layer.

2. The device according to claim 1, wherein a maximum impurity concentration in the first semiconductor layer is not greater than five times a maximum impurity concentration in the second base layer.

3. The device according to claim 1, wherein a maximum impurity concentration in the first semiconductor layer is not more than $1\times10^{18}$ cm$^{-3}$.

4. The device according to claim 1, wherein the second base layer has:
   a channel region covered by the first semiconductor layer; and
   a contact region not covered by the first semiconductor layer, the contact region contacting the second electrode.

5. The device according to claim 1, further comprising a second semiconductor layer that is a second conductivity type collector layer provided on the first electrode.

6. The device according to claim 1, further comprising:
   a second conductivity type buried layer disposed in the first base layer; and
   a buried electrode disposed in the second conductivity type buried layer to be below the gate electrode and being electrically connected to the second electrode.

7. The device according to claim 1, further comprising:
   a second conductivity type buried layer disposed in the first base layer; and
   a buried electrode disposed in a trench penetrating the second base layer to reach the second conductivity type buried layer, the trench being between a pair of gate electrodes, and the buried electrode being electrically connected to the second electrode so as to contact the second conductivity type buried layer.

8. The device according to claim 1, wherein the first semiconductor layer has a maximum impurity concentration that is less than or equal to twice a maximum impurity concentration of the second base layer.

9. A semiconductor device comprising:
   a first electrode;
   a first base layer provided on the first electrode and having a first conductivity type;
   a second base layer provided on the first base layer and having a second conductivity type;
   a first semiconductor layer provided on the second base layer and having the first conductivity type;
   a gate electrode having a first end at a first level that is closer to a first interface between the first semiconductor layer and the second base layer than to a second interface between the first base layer and the second base layer, and a second end at a second level that is closer to the second interface than to the first interface;
   a gate insulating film provided between the gate electrode and the second conductivity type base layer; and
   a second electrode provided on the first semiconductor layer and electrically connected to the first semiconductor layer,
   wherein a total amount of charge in the first semiconductor layer is such that a total amount of minority carriers in the second base layer is not greater than an total amount of charge in the second base layer in a state where a forward bias is applied across a pn junction between the second base layer and the first semiconductor layer.

10. The device according to claim 9, wherein the total amount of charge in the first semiconductor layer is within five times the total amount of charge in the second base layer.

11. The device according to claim 9, wherein an amount of charge per unit area in the first semiconductor layer is not more than $1\times10^{14}$ cm$^{-2}$.

12. The device according to claim 9, wherein the total amount of charge in the first semiconductor layer is less than or equal to twice the total amount of charge in the second base layer.

* * * * *